United States Patent
Tailliet et al.

(10) Patent No.: US 10,552,365 B2
(45) Date of Patent: Feb. 4, 2020

(54) BUFFER STAGE DEVICE THAT CAN BE CONNECTED TO A SERIAL PERIPHERAL INTERFACE BUS

(71) Applicant: STMicroelectronics (Rousset) SAS, Rousset (FR)

(72) Inventors: François Tailliet, Fuveau (FR); Chama Ameziane El Hassani, Aix en Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 71 days.

(21) Appl. No.: 15/902,473

(22) Filed: Feb. 22, 2018

(65) Prior Publication Data

US 2018/0322086 A1    Nov. 8, 2018

(30) Foreign Application Priority Data

May 5, 2017 (FR) ...................... 17 53971

(51) Int. Cl.

| | |
|---|---|
| *G06F 13/42* | (2006.01) |
| *G06F 13/38* | (2006.01) |
| *G06F 13/40* | (2006.01) |
| *H03K 19/00* | (2006.01) |
| *G06F 13/16* | (2006.01) |

(52) U.S. Cl.
CPC ...... *G06F 13/4291* (2013.01); *G06F 13/1673* (2013.01); *G06F 13/1689* (2013.01); *G06F 13/385* (2013.01); *G06F 13/4022* (2013.01); *G06F 13/4059* (2013.01); *G06F 13/4072* (2013.01); *H03K 19/0002* (2013.01)

(58) Field of Classification Search
None
See application file for complete search history.

(56) References Cited

U.S. PATENT DOCUMENTS

| 6,215,340 B1 | 4/2001 | Nomura | |
|---|---|---|---|
| 6,708,261 B1 * | 3/2004 | Shin ...................... | H03K 5/135 326/83 |
| 6,715,000 B2 * | 3/2004 | Cheung ................. | G06F 13/385 710/26 |
| 6,870,776 B2 * | 3/2005 | Kim ..................... | G11C 7/1051 365/189.05 |

(Continued)

OTHER PUBLICATIONS

'MPC5121e Serial Peripheral Interface (SPI)' Freescale Semiconductor Application Note, Document No. AN3904, Rev. 0, Aug. 2009. (Year: 2009).*

(Continued)

*Primary Examiner* — Steven G Snyder
(74) *Attorney, Agent, or Firm* — Slater Matsil, LLP (57) ABSTRACT

In some embodiments, a buffer stage device includes a data input for receiving a data signal, a clock input for receiving a clock signal, a data output and a processor that is configured to deliver, to the data output, the data from the data signal in synchronism with clock cycles of the clock signal. The processor includes a first buffer module configured to deliver, to the data output, each datum in synchronism with a first edge of the clock signal and during a first half of a clock cycle, and a second buffer module configured to hold the datum at the data output during the second half of the clock cycle.

25 Claims, 5 Drawing Sheets

(56) References Cited

U.S. PATENT DOCUMENTS

| | | | |
|---|---|---|---|
| 7,082,481 B2* | 7/2006 | Lambrache | G06F 13/4054 710/52 |
| 7,239,560 B2* | 7/2007 | Lee | G11C 7/1051 326/30 |
| 7,359,995 B2* | 4/2008 | Su | G06F 13/4072 326/83 |
| 7,426,145 B2* | 9/2008 | Lee | G11C 7/1051 326/30 |
| 7,508,232 B2* | 3/2009 | Lee | H03K 17/002 326/30 |
| 7,689,740 B2* | 3/2010 | Chou | G06F 13/4286 710/36 |
| 7,772,887 B2* | 8/2010 | Shankar | G06F 13/4072 326/83 |
| 8,051,224 B2* | 11/2011 | Chou | G06F 13/4286 710/15 |
| 8,427,892 B2* | 4/2013 | Venkataraman | G06F 13/1689 365/193 |
| 9,589,627 B1* | 3/2017 | Wilson | H03K 19/00315 |
| 9,734,099 B1* | 8/2017 | Argoetti | G06F 13/1689 |
| 9,842,071 B2* | 12/2017 | Casady | G06F 13/1673 |
| 10,284,358 B1* | 5/2019 | Dhalla | H04L 7/08 |
| 2001/0038303 A1 | 11/2001 | Nomura | |
| 2002/0133646 A1* | 9/2002 | Cheung | G06F 13/385 710/22 |
| 2004/0057322 A1* | 3/2004 | Kim | G11C 7/1051 365/230.06 |
| 2004/0098519 A1* | 5/2004 | Cheung | G06F 13/385 710/52 |
| 2004/0141391 A1* | 7/2004 | Lee | G11C 7/1051 365/200 |
| 2005/0114567 A1* | 5/2005 | Lambrache | G06F 13/4054 710/52 |
| 2007/0085568 A1* | 4/2007 | Su | G06F 13/4072 326/86 |
| 2008/0157811 A1* | 7/2008 | Lee | H03K 17/002 326/30 |
| 2008/0307126 A1* | 12/2008 | Chou | G06F 13/4286 710/52 |
| 2010/0030924 A1* | 2/2010 | Shankar | G06F 13/385 710/14 |
| 2010/0293308 A1* | 11/2010 | Chou | G06F 13/4286 710/52 |
| 2016/0132440 A1* | 5/2016 | Casady | G06F 13/1673 710/308 |
| 2017/0060803 A1 | 3/2017 | Shim | |
| 2017/0329363 A1* | 11/2017 | Mangalindan | G06F 1/12 |
| 2018/0365184 A1* | 12/2018 | van Wensen | G06F 13/364 |
| 2019/0026241 A1* | 1/2019 | Schumacher | G06F 13/3625 |

OTHER PUBLICATIONS

'KeyStone Architecture Serial Peripheral Interface (SPI) User Guide' by Texas Instruments, Literature No. SPRUGP2A, Mar. 2012. (Year: 2012).*

* cited by examiner

FIG 1.

PRIOR ART

BUFFER STAGE DEVICE THAT CAN BE CONNECTED TO A SERIAL PERIPHERAL INTERFACE BUS

CROSS-REFERENCE TO RELATED APPLICATIONS

This application claims priority to French Application No. 1753971, filed on May 5, 2017, which application is hereby incorporated herein by reference.

TECHNICAL FIELD

Embodiments of the invention relate to a buffer stage device that can be connected to a serial peripheral interface bus.

BACKGROUND

Two main features of conventional synchronous output buffer stages are the switching time (that is to say the time necessary for the logic circuits of the buffer to transmit a datum present at the input to the output upon the occurrence of a clock edge) and the amount of current supplied at the output, to be distributed at the input of the circuits that are connected thereto (the number of circuits connected thereto that an output is able to drive commonly being referred to using the term 'fan-out').

It is preferable for the switching time to be as short as possible, and for the 'fan-out' to be high, in particular in 'transistor-transistor' logic (TTL) systems or NMOS/PMOS transistor systems.

These two quantities are linked, and reducing the output impedance of the buffer increases the 'fan-out' and decreases the access time.

On the other hand, present systems produced using CMOS technology require a zero input current, and the communication frequencies, in particular on a Serial Peripheral Interface (SPI) bus, are becoming increasingly high. The switching time has thus become paramount in modern CMOS systems.

Figure 1:
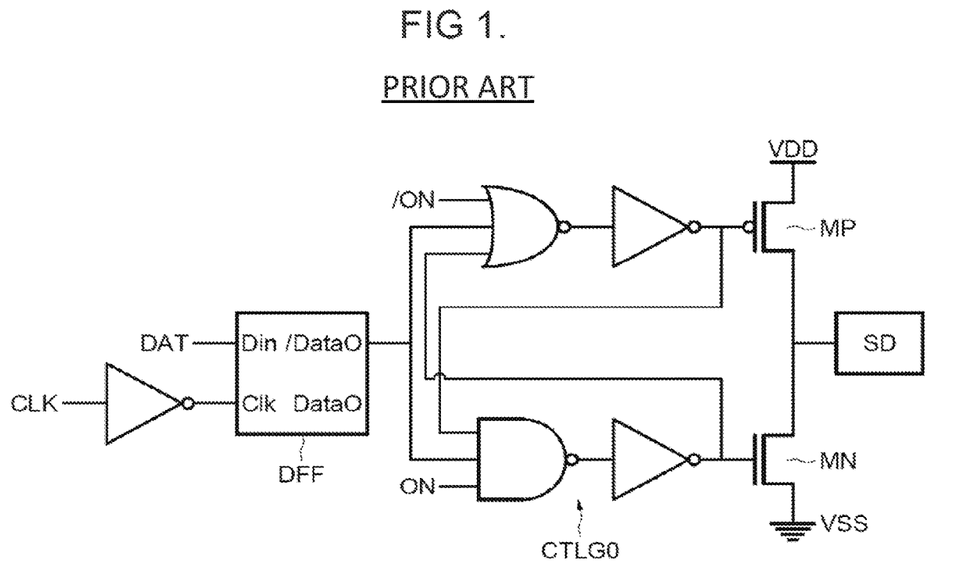
FIG. 1 schematically shows a conventional output buffer.

FIG. 1 shows an example of an output buffer, in which an inverter assembly including a pair of MOS transistors makes it possible to apply a 'high'-level or low'-level signal to an output node SD. A pull-down NMOS transistor MN is connected between a reference voltage source VSS and the output terminal SD, and a pull-up transistor MP is connected between a supply voltage source VDD and the output terminal SD.

The pull-down MN and pull-up MP transistors are controlled by a control logic circuit CTLGo, putting them into on- or off-states depending on an activation signal (ON, /ON) and on a signal representative of the datum to be communicated.

Moreover, the control logic circuit CTLGo is configured to minimize the occurrence of short-circuits between the high reference voltage source VDD and the low reference voltage source VSS. This kind of short circuit ('crossover conduction') occurs when an inverter changes state when a collision takes place, during which the two transistors are simultaneously on. This produces an ephemeral consumption of a very high current.

As a result, the control logic circuit CTLGo is configured to minimize this short-circuit current by preventing one transistor from changing to the on-state before the other has changed to the off-state.

The control logic circuit CTLGo includes three-input logic gates, controlling the pull-up transistor MP or the pull-down transistor MN, respectively. The logic gates receive the logic value of the datum to be transmitted/dataO, an activation signal ON, /ON, and the signal present on the gate of the other transistor MN, MP.

A control inverter makes it possible to apply the control voltage at a value corresponding to each transistor MN, MP, on the basis of the logic signals leaving the logic gates.

This so-called anti-collision assembly makes it possible, when switching takes place, to anticipate a transistor being off before the other transistor is turned on.

Furthermore, the pull-down MN and pull-up MP transistors are dimensioned such that their impedances in the on-state are low enough to meet requirements in terms of data access time, for a given capacitance at the data output terminal SD (for example, of a few tens of picofarads).

The data received by the buffer come from a D-type flip-flop (DFF) triggered on an edge of a clock signal CLK.

The switching period of such a buffer stage thus comprises the propagation time in the flip-flop DFF, the propagation time in the logic gates of the control logic circuit CTLGo, the delay of the anti-collision assembly, and a delay R*C stemming from the capacitance C at the output terminal SD (R being the on-state resistance of the transistors MN and MP).

From a clock edge, the propagation time in the D-type flip-flop includes (in terms of a 'logic layer,' representative of an elementary delay) two logic layers for generating the clock signal, and two logic layers for propagating the data signal.

The control logic circuit CTLGo, with an anti-collision assembly, introduces a delay of two logic layers for putting a transistor into the off-state, then of two logic layers for putting the other transistor into the on-state. This constitutes a total delay of eight logic layers.

In conventional buffer devices, increasing the switching speed is achieved by deactivating or by removing the anti-collision assemblies, and this produces large short-circuit currents.

Moreover, optimizing the switching speed requires very fast switching of the buffer stage transistors, from an off-state to an on-state. This makes it necessary to produce larger transistors, which have a smaller impedance in the on-state and generate even larger short-circuit currents.

SUMMARY

Embodiments of the invention relate to output buffer stage devices, in particular those coupled at the output of another component, for example, a non-volatile memory, and commonly referred to using the term 'output buffer' by those skilled in the art. Output buffer stage devices of this kind can be connected, for example, to an SPI bus.

Embodiments have been designed to try to find a compromise between the switching speed and the consumption stemming from collision short circuits, and improve how one of these features negatively impacts the other.

Now, in present technologies, the switching speed and power savings are paramount and embodiments increase them jointly.

To this end, according to one aspect, a buffer stage device includes a data input for receiving a data signal, a clock input for receiving a clock signal, a data output and a processor that is coupled to the data input, to the clock input and to the data output. The processor is configured to deliver, to the output, the data from the data signal in synchronism with clock cycles of the clock signal. According to one general feature of this device, the processor includes a first buffer module configured to deliver, to the data output, each datum in synchronism with a first edge of the clock signal and during a first half of a clock cycle, and a second buffer module configured to hold the datum at the data output during the second half of the clock cycle.

The first buffer module is thus responsible for a dynamic data transmission phase, starting at a first clock edge reflecting a potential transition of the logic value of the datum. At the end of a first half of a clock cycle, in the example of the SPI protocol, the receiver circuit has normally loaded the datum communicated on the SPI bus. This first buffer module may, for example, be configured to have a very fast switching time.

The second buffer module, for its part, is used to deliver a datum during a second half of the clock cycle in progress, over the course of a so-called static phase, not involving a transition from the previous datum. This second buffer module may, for example, be configured to optimize current consumption in the static phase.

According to one embodiment, the first buffer module is configured to respond to a joint delivery of a first datum by the first buffer module and of a second datum by the second buffer module to the data output by imposing the first datum on the data output.

Thus, in the event of a collision upon a transition of the datum to be transmitted to the output, it is the new datum that is communicated to the data output of the device, thus making it possible to increase the switching speed of the buffer stage device by avoiding uncertainty regarding the datum at the output during the collision time.

According to one embodiment, the first buffer module includes a first pull-up transistor and a first pull-down transistor, each having an impedance in the on-state that is lower than a low reference, and the second buffer module includes a second pull-up transistor and a second pull-down transistor, each having an impedance in the on-state that is higher than a high reference.

The first buffer module thus has a very fast switching time and takes precedence over the second buffer module in the event of a collision, the second buffer module allows a relatively low current to flow in the event of a collision, and makes it possible to comply with constraints on the minimum value of the high level of the output voltage and on the maximum value of the low level of the output voltage.

For example, the low reference may be set at 40 ohms and the high reference may be set at 1000 ohms. Other values are also possible.

According to one embodiment, each of the first and second pull-up transistors has its source coupled to a high-level reference voltage source and has its drain coupled to the data output, and each of the first and second pull-down transistors has its source coupled to a low-level reference voltage source and has its drain coupled to the data output.

According to one embodiment, the processor includes a trigger signal generator coupled to the clock input and configured to generate first and second buffer module trigger signals triggering the delivery of each datum by the first buffer module and the second buffer module, respectively.

The trigger signal generator may be configured to respond to a first edge of the clock signal by controlling the delivery of a first datum by the first buffer module, then controlling a stoppage of the delivery of a second datum by the second buffer module.

The trigger signal generator may be configured to respond to a second edge of the clock signal by controlling the delivery of a first datum by the second buffer module, then controlling by a stoppage of the delivery of the first datum by the first buffer module.

According to one embodiment, the processor includes a first flip-flop and a second flip-flop that are intended to communicate each datum from the data signal to the first buffer module and to the second buffer module, respectively, the trigger signal generator being configured to generate clock signals that control the flip-flops, respectively, so as to load the flip-flops with each datum in advance, before the respective triggering of the deliveries of each datum by the buffer modules.

The trigger signal generator is advantageously configured to put the first flip-flop into a stable state during a low level of the master clock signal and into a state able to load a datum during a high level of the clock signal, and to put the second flip-flop into a state able to load a datum during a low level of the clock signal and into a stable state during a high level of the clock signal.

For example, the data output may be intended to be connected to a serial peripheral interface bus.

The device is moreover advantageously produced in an integrated manner within an integrated circuit.

In another embodiment, a system includes an electrically erasable and programmable non-volatile memory that includes a memory plane and is able to perform a read operation in the memory plane. The system also includes a buffer stage device as defined above in which the data signal received by the buffer stage device results from a read operation in the memory plane.

An electronic appliance, such as a mobile telephone or a hearing aid, may advantageously include such a system.

BRIEF DESCRIPTION OF THE DRAWINGS

Other advantages and features of the invention will become apparent on examining the detailed description of wholly non-limiting embodiments and modes of implementation, and the appended drawings, in which.

DETAILED DESCRIPTION OF ILLUSTRATIVE EMBODIMENTS

Figure 2:
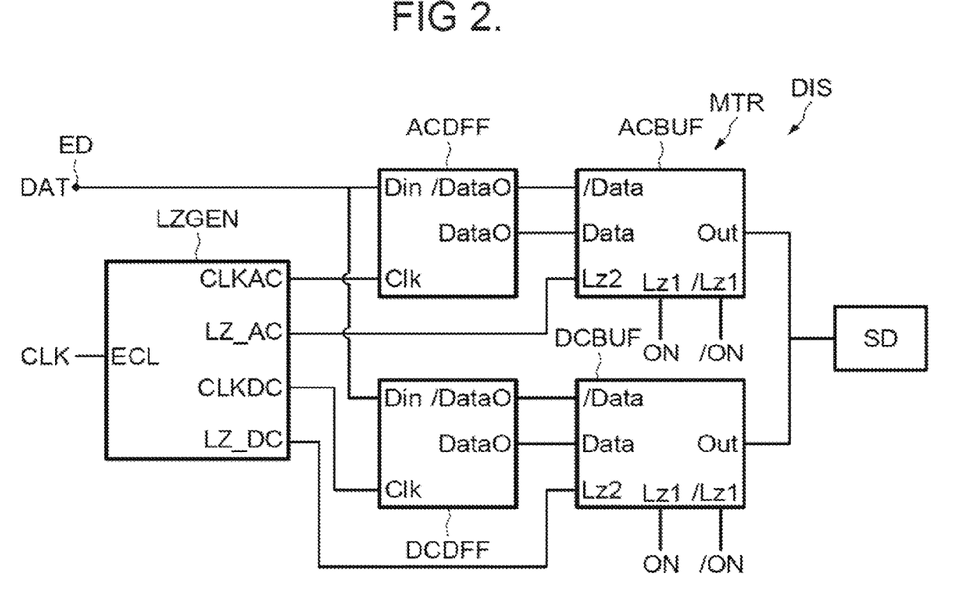
FIGS. 2 to 7 schematically show examples of embodiments and of modes of implementation of the invention.

FIG. 2 shows an example of a buffer stage device DIS, including a data input ED, a clock input ECL and a data output SD.

Processor MTR is coupled to the inputs ED, ECL, and to the output SD, and includes a trigger signal generator LZGEN, a first flip-flop ACDFF and a first buffer module ACBUF, as well as a second flip-flop DCDFF and a second buffer module DCBUF.

A data signal DAT, the data resulting, for example, from a read operation in a memory plane of an EEPROM memory, is transmitted to the data input ED, and a clock signal CLK is transmitted to the clock input ECL.

The clock signal CLK comes, for example, from a master device on an SPI bus, and is a signal with stepped oscillation, in a conventional and known manner. The high and low levels of the clock signal are termed polarities, and the period of the clock signal is termed clock cycle. A transition from a low polarity to a high polarity (and vice versa) is termed rising edge (and falling edge, respectively).

The trigger signal generator LZGEN is configured to generate, on the basis of the clock signal CLK, a first clock signal CLKAC in phase with the signal CLK, a second clock signal CLKDC in phase opposition with the signal CLK, and trigger signals LZ_AC, LZ_DC that are intended to control the buffer modules ACBUF, DCBUF.

The trigger signals LZ_AC, LZ_DC control a conditional and periodic activation of the buffer modules depending on the polarity of the clock signal. The trigger signals LZ_AC, LZ_DC are generated so as to be in phase opposition but with overlaps upon transitions of the clock signal CLK (that is to say the two signals simultaneously at a high level).

The flip-flops ACDFF, DCDFF are triggered on an edge of a clock signal applied to an input Clk, and a logic datum present at an input Din is held at an output DataO, and the contrapositive of this datum is held at an output/DataO, until a subsequent edge of the clock signal.

The inputs Clk of the flip-flops ACDFF, DCDFF receive the clock signals CLKAC, CLKDC, respectively, that are generated by the trigger signal generator CLKGEN, and the inputs Din receive the data signal DAT to be transmitted to the data output SD of the buffer stage device DIS.

The buffer modules ACBUF, DCBUF receive the signal transmitted by the outputs /DataO of the respective flip-flops ACDFF, DCDFF at an input/Data, the respective trigger signals LZ_AC, LZ_DC at an input LZ2, and activation signals ON, /ON at inputs Lz1, /Lz1. Each buffer module ACBUF, DCBUF includes an output Out, both of which are linked to the data output SD.

The trigger signals LZ_AC, LZ_DC, when they are at a high level, activate the respective output buffer modules ACBUF and DCBUF, which deliver the contrapositive value of the logic signal present at their inputs/Data to the output Out.

The trigger signal generator is configured to generate the trigger signals LZ_AC, LZ_DC such that the first buffer module ACBUF delivers, to the data output SD, each datum DAT in synchronism with a first edge of the clock signal CLK and during a first half of a clock cycle, and such that the second buffer module DCBUF holds the datum DAT at the data output SD during the second half of the clock cycle.

Figure 3:
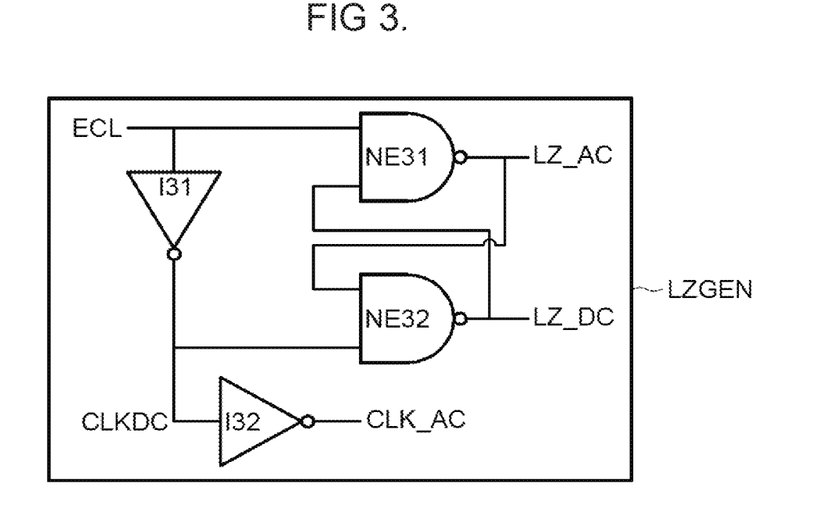

FIG. 3 shows an exemplary embodiment of the trigger signal generator LZGEN.

In this example, the trigger signal generator LZGEN has an SR latch structure, including two NAND gates NE31 and NE32, the output of each being fed back to an input of the other.

The other input of the first NAND gate NE31 is linked to the clock input ECL and receives the clock signal CLK.

The other input of the second NAND gate NE32, for its part, receives the inverted signal of the clock signal CLK via an inverter I31. This inverted signal is used as clock signal CLKDC. The signal CLKAC is obtained using an inverter I32 inverting the signal CLKDC.

The output of the first NAND gate NE31 delivers the first trigger signal LZ_AC, and the output of the second NAND gate NE32 delivers the second trigger signal LZ_DC.

By virtue of its NAND gate design, a transition of a trigger signal LZ_AC, LZ_DC from a high level to a low level requires the other trigger signal to be stabilized at a high level, whereas a transition from a low level to a high level may take place regardless of the value of the other signal.

At each clock edge of the signal CLK, an overlap in the high state of the two signals LZ_AC and LZ_DC thus occurs during a brief instant of stabilization of the logic circuits of the trigger signal generator LZGEN.

In other words, upon a first edge of the clock signal, the trigger signal generator controls the delivery of a first datum by the first buffer module ACBUF, and then controls a stoppage of the delivery of a second datum (that is to say the datum preceding the first datum) by the second buffer module DCBUF.

Furthermore, upon a second edge of the clock signal, the trigger signal generator controls the delivery of a first datum by the second buffer module DCBUF, then controls a stoppage of the delivery of the first datum by the first buffer module ACBUF.

These overlaps of the trigger signals LZ_AC, LZ_DC will become apparent in more detail below in relation to FIG. 6.

Figure 4:
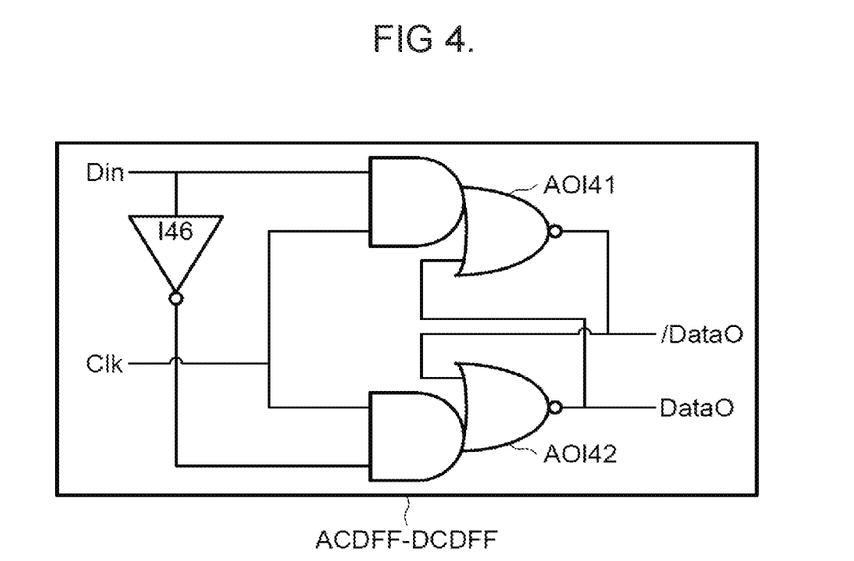

FIG. 4 shows an exemplary embodiment of the flip-flops ACDFF, DCDFF.

The first flip-flop ACDFF and the second flip-flop DCDFF may have an identical and traditional D-type flip-flop architecture.

Each flip-flop ACDFF-DCDFF includes two AND-OR-invert gates AOI41, AOI42, each having two AND inputs and one NOR input.

Complex logic AND-OR-invert gates have the advantage of having a single logic layer of switching delay.

The two AND-OR-invert gates AOI41, AOI42 receive, at a first AND input, a clock signal present at a clock input Clk of the flip-flop.

A second AND input of each AND-OR-invert gate AOI41, AOI42 receives a data signal present at an input Din of the flip-flop and this data signal inverted by an inverter I46, respectively.

The output/DataO of the AND-OR-invert gate AOI41 is connected to the NOR input of the other AND-OR-invert gate AOI42, and the output DataO of this other AND-OR-invert gate AOI42 is connected to the NOR input of the AND-OR-invert gate AOI41.

The two outputs DataO and/DataO thus deliver the logic signal applied at the input Din and the contrapositive of this signal, respectively, by following its transitions when the clock signal is at a high level, and by holding the previous signal when the clock signal is at a low level.

In the context of the buffer stage device DIS described above in relation to FIG. 2, the first clock signal CLKAC is supplied to the input Clk of the first flip-flop ACDFF, and the second clock signal CLKDC is supplied to the input Clk of the second flip-flop DCDFF, the datum DAT is supplied to the inputs Din of the two flip-flops, and the outputs/DataO, DataO are connected to the inputs/Data, Data of the first and of the second buffer module ACBUF, DCBUF, respectively.

Figure 5:
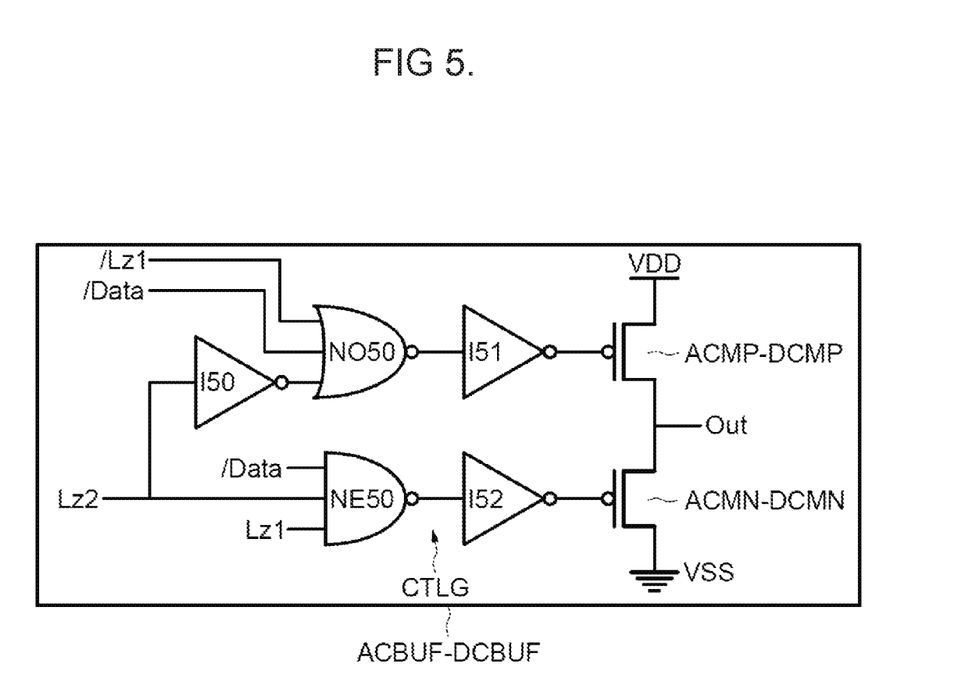

FIG. 5 shows an exemplary embodiment of either one of the first buffer module ACBUF and second buffer module DCBUF.

The first buffer module ACBUF includes a first pull-up PMOS transistor ACMP, the source of which is coupled to a high-level reference voltage source VDD and the drain of which is coupled to the output Out of the buffer module, and a first pull-down NMOS transistor ACMN, the source of which is coupled to a low-level reference voltage source VSS and the drain of which is coupled to the output Out of the buffer module.

The output Out of the first buffer module ACBUF is intended to be coupled to the data output SD of the buffer stage device DIS.

Moreover, the first pull-up transistor ACMP and the first pull-down transistor ACMN each have an impedance in the on-state that is lower than a low reference, for example, of 40 ohms.

Specifically, in the example of an SPI circuit, if the data are transmitted on a falling edge of a clock signal and latched by a receiver on a rising edge of the clock signal, communication at 100 MHz requires the data signal to have reached the valid level 5 ns after the falling edge at the latest, on a bus having a capacitance of 30 pF. Taking into account the internal delays of the logic circuits, the maximum data transition period is of the order of 2 ns. This corresponds to a maximum impedance of the order of 40 ohms for the first pull-up ACMP and pull-down ACMN transistors in the on-state.

The first buffer module ACBUF thus delivers a 'strong' signal at its output Out and has a very fast switching time.

The second buffer module DCBUF includes a second pull-up PMOS transistor DCMP, the source of which is coupled to a high-level reference voltage source VDD and the drain of which is coupled to the output Out of the buffer module, and a second pull-down NMOS transistor DCMN, the source of which is coupled to a low-level reference voltage source VSS and the drain of which is coupled to the output Out of the buffer module.

The output Out of the second buffer module DCBUF is also intended to be coupled to the data output SD of the buffer stage device DIS.

Moreover, the second pull-up transistor DCMP and the second pull-down transistor DCMN each have an impedance in the on-state that is higher than a high reference, for example, 1000 ohms.

Specifically, a typical constraint is a minimum high-level value at Vdd-0.2 V and a maximum low-level value at Vss+0.2 V for a load of 100 µA (with Vdd being the high-level reference voltage value and Vss being the low-level reference voltage value). This gives a maximum impedance of approximately 2000 ohms for the second pull-up DCMP and pull-down DCMN transistors in the on-state.

It is therefore possible to dimension the second transistors such that they have an impedance in the on-state that is as high as possible and lower than 2000 ohms, for example, higher than 1000 ohms.

The second buffer module DCBUF thus delivers a 'weak' signal at its output Out and has a longer switching time, but allows little current to flow to the output SD.

Each of the buffer modules ACBUF, DCBUF includes a control logic circuit CTLG having the same architecture, in which inverters I51, I52 supply gate voltages suitable for controlling the respective pull-up transistor ACMP-DCMP and pull-down transistor ACMN-DCMN.

The control logic circuit CTLG includes a three-input NAND gate NE50 receiving an activation signal at an input Lz1, a trigger signal at an input Lz2 and a data signal at an input /Data. The output of the gate NE50 is connected to the input of the inverter I52.

A three-input NOR gate NO50, for its part, receives the contrapositive of the activation signal at an input/Lz1, the trigger signal inverted by an inverter I50 at the input Lz2 and a data signal at an input/Data. The output of the gate NO50 is connected to the input of the inverter I51.

When the activation signal ON is at a high level at Lz1 (and its contrapositive/ON is at a low level at/Lz1), and the trigger signal LZ_AC-LZ_DC is at a high level at Lz2, the buffer module ACBUF-DCBUF thus delivers a high VDD or low VSS reference voltage representative of the contrapositive logic value of the signal at the input/Data (that is to say, in the context of the device described in relation to FIG. 2, the logic value of the signal DAT, loaded into the flip-flop, the contrapositive of which is transmitted to the input/Data).

Figure 6:
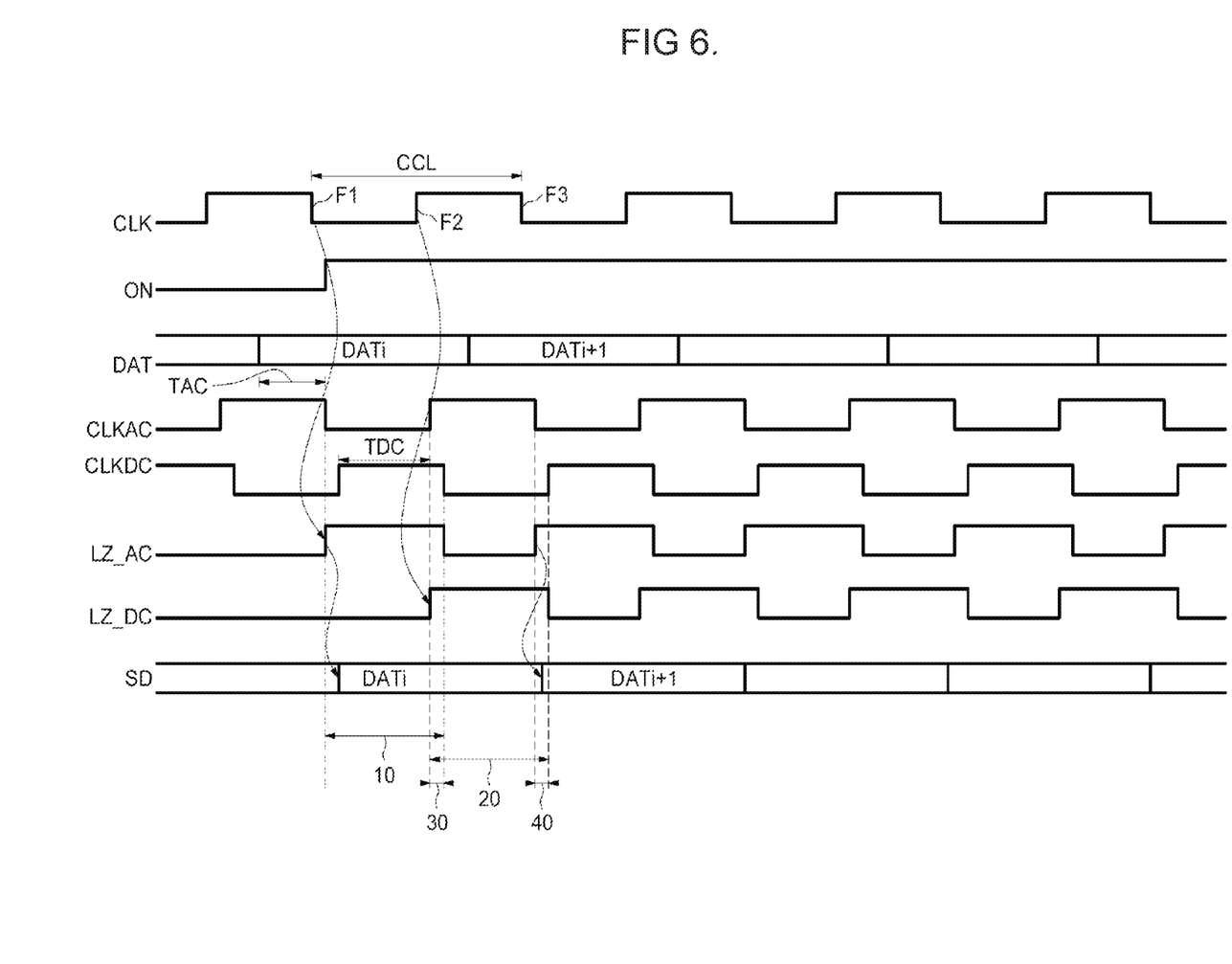

FIG. 6 shows the timing diagrams of various signals of the buffer stage device DIS described previously in relation to FIGS. 2 to 5, for example, in the context of a communication of data on an SPI bus.

A clock signal CLK is received at the input ECL and clocks the execution of the operations of the buffer stage device DIS.

A clock cycle CCL includes a first edge F1 (a falling edge in this case), followed by a first clock polarity (a low level in this case), and a second edge F2 (a rising edge in this case), followed by a second clock polarity (a high level in this case).

The first clock signal CLKAC and the second clock signal CLKDC are in phase and in phase opposition, respectively, with the clock signal CLK.

The data DAT are transmitted to the data input ED in synchronism with the clock cycles CCL, but with a temporal shift. A datum DATi is thus transmitted to the input Din of the first flip-flop ACDFF before the falling edge of the first clock signal CLKAC.

As a result, the first flip-flop is loaded in advance by a time TAC that is longer than the time necessary to establish stability in the logic gates contained in the flip-flop.

The first flip-flop therefore delivers the contrapositive logic value of this datum DATi to its output/DataO before the falling edge F1 of the cycle CCL.

As a result, the first buffer module ACBUF is 'prepared' to transmit the logic signal of the datum DATi to the data output SD, as soon as the first trigger signal LZ_AC changes to a high level.

In the first buffer module ACBUF, the first pull-up ACMP and pull-down ACMN transistors are off, as the first trigger signal LZ_AC is at a low level, and the input/Data carries the data signal in advance.

The falling edge F1 of the clock signal CLK causes the first trigger signal LZ_AC to transition from a low to high level, which transition incurs a delay of a single logic layer resulting from the switching of the gate NE31, in the example of the architecture described previously in relation to FIG. 3.

The first trigger signal LZ_AC triggers, from its rising edge, the control logic circuit CTLG controlling the conduction of either one of the first pull-up ACMP or pull-down ACMN transistors in relation to the logic value at the input/Data.

Given that the datum is applied to the input/Data in advance, it is not possible for any internal conflict between the pull-up ACMP and pull-down ACMN transistors to occur upon the control (that is to say that they cannot simultaneously be in the on-state).

The transmission delay of the first buffer module ACBUF thus stems from two logic layers NE50 and I52, or at most from three logic layers I50, NO50 and I51.

As a result, the transmission of the datum DATi to the data output SD is delayed by only four logic layers at most, from the falling edge F1 of the clock signal CLK.

Furthermore, as the pull-up ACMP and pull-down ACMN transistors are dimensioned so as to have an impedance in the on-state that is lower than a low reference, for example, 40 ohms in the context of an SPI bus, they switch very quickly, making the transmission of the data to the data output SD all the faster.

The first buffer module ACBUF thus delivers the datum DATi to the output SD during a first half 10 of the clock cycle CCL, during the high level, until the first trigger signal LZ_AC changes to a low level, corresponding to the rising edge F2 of the clock signal CLK.

The datum DATi is likewise transmitted to the input Din of the second flip-flop DCDFF before the falling edge of the second clock signal CLKDC.

As a result, the second flip-flop DCDFF is loaded in advance by a time TDC that is longer than the time necessary for stability in the logic gates contained in the flip-flop.

The second flip-flop therefore delivers the contrapositive logic value of this datum DATi to its output/DataO before the rising edge F2 of the cycle CCL.

As a result, the second buffer module DCBUF is 'prepared' to transmit the logic signal of the datum DATi to the output SD, as soon as the second trigger signal LZ_DC changes to a high level.

In the second buffer module DCBUF, the second pull-up ACMP and pull-down ACMN transistors are off, as the second trigger signal LZ_DC is at a low level, and the input /Data carries the data signal in advance.

The rising edge F2 of the clock signal CLK causes the second trigger signal LZ_DC to transition from a low to high level, incurring a delay of two logic layers resulting from the switching of the two gates I31 and NE32, in the example of the architecture described previously in relation to FIG. 3.

The second high-level trigger signal LZ_DC triggers the control logic circuit CTLG, controlling the conduction of either one of the second pull-up DCMP or pull-down DCMN transistors in relation to the logic value at the input/Data.

Given that the datum is applied to the input/Data in advance, it is not possible for any internal conflict between the pull-up DCMP and pull-down DCMN transistors to occur upon the control (that is to say that they are simultaneously in the on-state).

Moreover, the rising edge F2 of the clock signal CLK causes the first trigger signal LZ_AC to transition from a high to low level, conditional upon the second trigger signal LZ_DC changing to the high level. As a result, the transition of the first trigger signal LZ_AC from a high to low level incurs a delay of three logic layers resulting from the switching of the three gates I31, NE32 and NE31, in the example of the architecture described previously in relation to FIG. 3.

Thus, during an instant 30 of overlap, the first trigger signal LZ_AC and the second trigger signal LZ_DC are jointly at a high level, and the respective buffer modules ACBUF and DCBUF jointly deliver a datum to the output SD.

That being the, as the second buffer module DCBUF delivers the same datum DATi as the first buffer module ACBUF, this overlap does not generate a conflict.

The second buffer module DCBUF then delivers the datum DATi during a second half 20 of the clock cycle CCL, until the second trigger signal LZ_DC changes to a low level, corresponding to the following falling edge F3 of the clock signal CLK.

The following falling edge F3 of the clock signal CLK causes the first trigger signal LZ_AC to transition from a low to high level, which transition incurs a delay of a single logic layer resulting from the switching of the gate NE31, in the example of the architecture described previously in relation to FIG. 3.

However, the following falling edge F3 of the clock signal CLK causes the second trigger signal LZ_DC to transition from a high to low level, conditional upon the first trigger signal LZ_AC changing to the high level. As a result, the transition of the second trigger signal LZ_DC from a high to low level incurs a delay of three logic layers resulting from the switching of the three gates NE31, I31 and NE32, in the example of the architecture described previously in relation to FIG. 3.

As a result, during an instant 40 of overlap, the first trigger signal LZ_AC and the second trigger signal LZ_DC are jointly at a high level, and the respective buffer modules ACBUF and DCBUF jointly deliver a datum to the output SD.

By contrast, as this instant 40 corresponds to the transmission of a new datum DATi+1, a transition of the logic value at the output SD may occur at this instant, thereby resulting in an electrical conflict between the two respective reference voltage terminals VDD, VSS of the first buffer module ACBUF and of the second buffer module DCBUF.

That being the case, as the on-state impedances of the first transistors ACMP, ACMN of the first buffer module ACBUF are much lower than the on-state impedances of the second transistors DCMP, DCMN of the second buffer module DCBUF, the new datum DATi+1 transmitted by the first buffer module ACBUF will be imposed on the old datum DATi at the data output SD.

Furthermore, as the on-state impedance of the second transistors DCMP, DCMN of the second buffer module DCBUF is high, the current (Iconflict) that has flowed during this instant of conflict 40 is modest, typically much lower than the capacitive current peak I that occurs at the same time when the voltage at the output (Vbus) switches: I=Cbus*d/dt(Vbus)>>Iconflict, with Cbus being the capacitance at the output ES.

Figure 7:
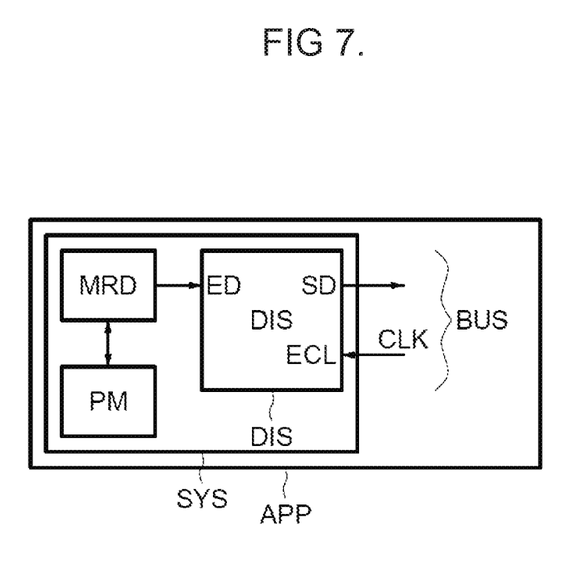

FIG. 7 shows a system SYS including a buffer stage device DIS of the kind described in relation to FIG. 2, an electrically erasable and programmable read-only memory (EEPROM) memory plane PM, and read circuit MRD able to perform read operations on the data stored in the memory plane PM.

The read circuit MRD communicates data, for example, read in the memory plane PM, to the data input ED of the buffer stage device DIS.

The buffer stage device DIS receives a clock signal CLK at a clock input ECL, and delivers, to the data output SD, the data supplied by the read circuit MRD in synchronism with the clock signal CLK.

The data output SD and the clock input ECL of the buffer stage device DIS belong, in this example, to an SPI bus BUS.

Moreover, this system SYS may belong to an electronic appliance APP, for example, a mobile telephone or a hearing aid.

That being the, the buffer stage device DIS may be integrated into any kind of appliance or system for transmitting data in an optimized manner and in accordance with a protocol compatible with the operation thereof, such as described above in particular in relation to FIG. 6.

In summary, a buffer stage device of the kind described previously advantageously makes use of the fact that situations involving the transition of data at the output and holding the datum at the output have different requirements.

The device thus does not generate the signal representative of a datum using the same transistors, depending on the transient or steady state of the data delivery.

A so-called 'strong' output buffer is used in the transient phase to achieve a fast access time. It is active from a falling clock edge when a new datum needs to be delivered, until the next clock edge when these data are loaded by the receiver.

Another so-called 'weak' output buffer is used in the steady state and makes it possible to limit current consumption. It is active from the rising clock edge when the data are loaded by the receiver, until the following falling clock edge when a new datum is transmitted.

As the power consumption of the logic gates is low, producing two separate buffer modules does not substantially increase power consumption, but makes it possible to prevent high short-circuit current consumptions between the supply voltage and reference voltage sources.

In terms of speed, the transmission time is conditional upon the control logic circuit.

Specifically, the propagation delay of the D-type flip-flops does not influence the transmission, as the data leaving the flip-flops are transmitted to the control logic of the output buffer before the falling clock edge.

The buffer stage device thus has the advantage of being faster and using less power than output buffer stages with conventional designs.

Moreover, the invention is not limited to these embodiments, but incorporates all variants thereof. For example, the falling-edge triggering has been given by way of example, and the invention may be adapted to rising-edge triggering.

What is claimed is:

1. A buffer stage device, comprising:
    a data input configured to receive a data signal;
    a clock input configured to receive a clock signal;
    a data output; and
    a processor coupled to the data input and the clock input and configured to deliver, to the data output, data from the data signal in synchronism with clock cycles of the clock signal, wherein the processor includes a first buffer module configured to deliver, to the data output, each datum in synchronism with a first edge of the clock signal and during a first half of a clock cycle, and a second buffer module configured to hold the datum at the data output during a second half of the clock cycle, wherein the first buffer module comprises a first pull-up transistor and a first pull-down transistor that each have an impedance in the on-state that is lower than a low threshold, and wherein the second buffer module comprises a second pull-up transistor and a second pull-down transistor that each have an impedance in the on-state that is higher than a high threshold, the high threshold being higher than the low threshold.

2. The device of claim 1, wherein the first buffer module is configured to respond to a joint delivery of a first datum by the first buffer module and of a second datum by the second buffer module to the data output by imposing the first datum on the data output.

3. The device of claim 1, wherein the low threshold is 40 ohms and the high threshold is 1000 ohms.

4. The device of claim 1, wherein each of the first and second pull-up transistors has a source coupled to a high-level reference voltage source and has a drain coupled to the data output, and each of the first and second pull-down transistors has a source coupled to a low-level reference voltage source and has a drain coupled to the data output.

5. The device of claim 4, wherein the first buffer module comprises:
    a first logic circuit having an output coupled to a control terminal of the first pull-up transistor, the first logic circuit configured to receive a trigger signal; and
    a second logic circuit having an output coupled to the first pull-down transistor, the second logic circuit configured to receive the trigger signal.

6. The device of claim 5, wherein the first logic circuit comprises:

a first inverter having an output coupled to the control terminal of the first pull-up transistor;
    a NOR gate having an output coupled to the first inverter; and
    a second inverter having an output coupled to the NOR gate, the second inverter configured to receive the trigger signal, and wherein the second logic circuit comprises:
        a third inverter having an output coupled to the control terminal of the first pull-down transistor; and
        a NAND gate having an output coupled to the third inverter, the NAND gate configured to receive the trigger signal.

7. The device of claim 1, wherein the processor further comprises a trigger signal generator coupled to the clock input and configured to generate first and second buffer module trigger signals to trigger delivery of each datum by the first buffer module and the second buffer module, respectively.

8. The device of claim 7, wherein the trigger signal generator is configured to respond to a first edge of the clock signal by controlling a delivery of a first datum by the first buffer module, and controlling a stoppage of the delivery of a second datum by the second buffer module.

9. The device of claim 7, wherein the trigger signal generator is configured to respond to a second edge of the clock signal by controlling a delivery of a first datum by the second buffer module, and controlling a stoppage of the delivery of the first datum by the first buffer module.

10. The device of claim 7, wherein the trigger signal generator comprises:
    a first NAND gate having an output coupled to the first buffer module, and an input coupled to the clock input;
    a second NAND gate having an output coupled to the second buffer module and to a second input of the first NAND gate, and a first input coupled to the output of the first NAND gate; and
    a first inverter having an input coupled to the clock input and an output coupled to the second NAND gate.

11. The device of claim 7, wherein the processor includes a first flip-flop and a second flip-flop that are configured to communicate each datum from the data signal to the first buffer module and to the second buffer module, respectively, the trigger signal generator being configured to generate a first and second clock signals that control the first and second flip-flops, respectively, so as to load the flip-flops with each datum in advance, before respective triggering of deliveries of each datum by the buffer modules.

12. The device of claim 11, wherein the trigger signal generator is configured to put the first flip-flop into a stable state during a low level of the clock signal and into a state able to load a datum during a high level of the clock signal, and to put the second flip-flop into a state able to load a datum during a low level of the clock signal and into a stable state during a high level of the clock signal.

13. The device of claim 1, wherein the data output is coupled to a serial peripheral interface bus.

14. The device of claim 1, wherein the clock input is coupled to a master device via serial peripheral interface bus.

15. A system comprising:
    an electrically erasable and programmable non-volatile memory that includes a memory plane;
    a clock circuit; and
    a processor with a data input terminal coupled to the memory and a clock input terminal coupled to the clock circuit, the processor configured to deliver, to a data output terminal, data from a data signal of the data input terminal in synchronism with clock cycles of a clock signal of the clock input terminal, wherein the processor includes a first buffer module configured to deliver, to the data output terminal, each datum in synchronism with a first edge of the clock signal and during a first half of a clock cycle, and a second buffer module configured to hold the datum at the data output terminal during a second half of the clock cycle, wherein the first buffer module comprises a first pull-up transistor and a first pull-down transistor that each have an impedance in the on-state that is lower than a low threshold, and wherein the second buffer module comprises a second pull-up transistor and a second pull-down transistor that each have an impedance in the on-state that is higher than a high threshold, the high threshold being higher than the low threshold.

16. The system according to claim 15, wherein the system is a portion of a mobile telephone.

17. The system according to claim 15, wherein the system is a portion of a hearing aid.

18. A method comprising:
receiving a data signal;
receiving a clock signal;
storing data of the data signal in a first buffer module;
storing the data of the data signal in a second buffer module; and
outputting the data of the data signal in synchronism with clock cycles of the clock signal, wherein the data is output from the first buffer module in synchronism with a first edge of the clock signal and during a first portion of each clock cycle, and wherein the data is output from the second buffer module during a remaining portion of the clock cycle, wherein the first buffer module comprises a first pull-up transistor and a first pull-down transistor that each have an impedance in the on-state that is lower than a low threshold, and wherein the second buffer module comprises a second pull-up transistor and a second pull-down transistor that each have an impedance in the on-state that is higher than a high threshold, the high threshold being higher than the low threshold.

19. The method of claim 18, wherein receiving the clock signal comprises receiving the clock signal from a serial peripheral interface bus.

20. The method of claim 18, wherein outputting the data comprises outputting the data from the first buffer module with a first strength, and outputting the data from the second buffer module with a second strength weaker than the first strength.

21. The method of claim 18, wherein the low threshold is 40 ohms and the high threshold is 1000 ohms.

22. The method of claim 18, further comprising generating, based on the clock signal, first and second buffer module trigger signals to trigger delivery of each datum by the first buffer module and the second buffer module, respectively, wherein the first and second buffer module trigger signals are in phase opposition, and wherein the first and second buffer module trigger signals overlap upon transitions of the clock signal.

23. A buffer circuit comprising:
a data input terminal;
a clock input terminal;
a data output terminal;
a trigger signal generator circuit having an input coupled to the clock input terminal;
a first buffer circuit having a first input coupled to the data input terminal, a second input coupled to a first trigger output of the trigger signal generator circuit, and an output coupled to the data output terminal; and
a second buffer circuit having a first input coupled to the data input terminal, a second input coupled to a second trigger output of the trigger signal generator circuit, and an output coupled to the data output terminal, wherein the first buffer circuit comprises a first pull-up transistor and a first pull-down transistor that each have an impedance in the on-state that is lower than a low threshold, and wherein the second buffer circuit comprises a second pull-up transistor and a second pull-down transistor that each have an impedance in the on-state that is higher than a high threshold, the high threshold being higher than the low threshold.

24. The buffer circuit of claim 23, further comprising:
a first flip-flop coupled between the data input terminal and the first buffer circuit, the first flip-flop having a clock input coupled to a first clock output of the trigger signal generator circuit; and
a second flip-flop coupled between the data input terminal and the second buffer circuit, the second flip-flop having a clock input coupled to a second clock output of the trigger signal generator circuit.

25. The buffer circuit of claim 24, wherein the trigger signal generator circuit comprises:
a first NAND gate having an output coupled to the first trigger output of the trigger signal generator circuit, and an input coupled to the clock input terminal;
a second NAND gate having an output coupled to the second trigger output of the trigger signal generator circuit and to a second input of the first NAND gate, and a first input coupled to the output of the first NAND gate; and
a first inverter having an input coupled to the clock input and an output coupled to the second NAND gate.

* * * * *